(12) United States Patent
Uno et al.

(10) Patent No.: US 8,558,622 B2
(45) Date of Patent: Oct. 15, 2013

(54) RADIO FREQUENCY POWER AMPLIFIER

(75) Inventors: Takashi Uno, Hyogo (JP); Kazuhiro Yahata, Osaka (JP); Toshio Ishizaki, Hyogo (JP)

(73) Assignee: Panasonic Corporation, Osaka (JP)

( * ) Notice: Subject to any disclaimer, the term of this patent is extended or adjusted under 35 U.S.C. 154(b) by 75 days.

(21) Appl. No.: 13/379,450

(22) PCT Filed: Jul. 9, 2010

(86) PCT No.: PCT/JP2010/004465
§ 371 (c)(1),
(2), (4) Date: Dec. 20, 2011

(87) PCT Pub. No.: WO2011/007529
PCT Pub. Date: Jan. 20, 2011

(65) Prior Publication Data
US 2012/0098598 A1    Apr. 26, 2012

(30) Foreign Application Priority Data

Jul. 14, 2009    (JP) ................................ 2009-165628

(51) Int. Cl.
*H03F 3/191*    (2006.01)
(52) U.S. Cl.
USPC ........................................................ 330/302
(58) Field of Classification Search
USPC .............................................. 330/277, 302
See application file for complete search history.

(56) References Cited

U.S. PATENT DOCUMENTS

| | | | |
|---|---|---|---|
| 5,270,668 A | 12/1993 | Ikeda et al. | |
| 5,352,990 A | 10/1994 | Goto | |
| 5,406,226 A * | 4/1995 | Cioffi et al. | 330/306 |
| 5,592,122 A * | 1/1997 | Masahiro et al. | 330/286 |
| 6,724,263 B2 * | 4/2004 | Sugiura | 330/302 |
| 8,076,994 B2 * | 12/2011 | Farrell et al. | 333/32 |
| 2001/0045867 A1* | 11/2001 | Miyashita et al. | 330/302 |
| 2005/0104679 A1 | 5/2005 | Blednov | |
| 2007/0296506 A1 | 12/2007 | Mizutani | |
| 2008/0252382 A1 | 10/2008 | Takagi | |
| 2008/0272443 A1 | 11/2008 | Hoshi et al. | |

FOREIGN PATENT DOCUMENTS

| | | |
|---|---|---|
| JP | 63-279608 | 11/1988 |
| JP | 1-279612 | 11/1989 |
| JP | 4-298105 | 10/1992 |
| JP | 4-326206 | 11/1992 |
| JP | 6-204764 | 7/1994 |

(Continued)

OTHER PUBLICATIONS

International Search Report issued Aug. 31, 2010 in International (PCT) Application No. PCT/JP2010/004465.

*Primary Examiner* — Khanh V Nguyen
(74) *Attorney, Agent, or Firm* — Wenderoth, Lind & Ponack, L.L.P.

(57) ABSTRACT

A radio frequency power amplifier includes a transistor and amplifies a radio frequency signal of a first frequency; an input matching circuit connected to an input terminal of the transistor; and an output matching circuit connected to an output terminal of the transistor. A reactance control circuit includes one end connected to the output terminal of the transistor, and the other end connected to an input terminal of an output matching circuit and a bias terminal. The reactance control circuit has a reactance which resonates at a second frequency with a parasitic capacitance of the transistor at the output terminal of the transistor, and the second frequency is identical or close to the first frequency.

14 Claims, 8 Drawing Sheets

(56) References Cited

FOREIGN PATENT DOCUMENTS

| | | |
|---|---|---|
| JP | 9-186536 | 7/1997 |
| JP | 2738701 | 4/1998 |
| JP | 2883218 | 4/1999 |
| JP | 2005-521312 | 7/2005 |
| JP | 2006-333201 | 12/2006 |
| JP | 2007-336048 | 12/2007 |
| JP | 2008-263438 | 10/2008 |
| JP | 2008-277604 | 11/2008 |
| WO | 03/081670 | 10/2003 |

* cited by examiner

Frequency (2.000 GHz to 3.000 GHz)

Power Added Efficiency (PAE) = 60.3%

Power Added Efficiency (PAE) = 58.9%

Power Added Efficiency (PAE) = 65.0%

RADIO FREQUENCY POWER AMPLIFIER

BACKGROUND OF INVENTION

1. Technical Field

The present invention relates to a radio frequency power amplifier, and, in particular, to a technique for increasing the efficiency of a high-power radio frequency power amplifier.

2. Background Art

Radio frequency power amplifiers are devices which output an amplified input signal, and are widely used in mobile communication terminals and base stations. However, radio frequency power amplifiers require a large amount of power and consume most of the supplied power needed to drive radio frequency generator circuits or transmitter circuits, hindering the low power consumption of mobile communication terminals and base stations. Accordingly, there has long been a need for a radio frequency power amplifier with decreased driving power.

A radio frequency power amplifier has input and output characteristics such that when the input power is low, the input signal is amplified while maintaining constant gain (in the linear region). As the input power increases, nonlinearity of the amplifying element causes gain compression, and output power becomes constant regardless of the input power level (in the saturation region).

In general, radio frequency power amplifiers used in mobile communication terminals and base stations operate in the linear region and widely employ a Doherty amplifier to increase the power added efficiency (PAE) of the radio frequency power amplifier.

A Doherty amplifier includes a carrier amplifier and a peak amplifier connected in parallel. When the input power is low, only the carrier amplifier is driven; when the input power is high, both carrier and peak amplifiers are driven. As a result, the power added efficiency of the whole amplifier increases, regardless of the input power level.

Additionally, a class F amplifier, which is a generally known radio frequency power amplifier with the ability to operate with high efficiency, is an amplifier that reduces the amount of power consumed inside the amplifying element by tuning the termination condition of the harmonic wave and shaping the voltage waveform and current waveform applied to the amplifying element output terminal (For example see PTL 1).

FIG. 13 is a circuit diagram showing an example of a class F amplifier (class F amplifier circuit) that is a conventional radio frequency power amplifier using a field effect transistor (FET).

A conventional radio frequency power amplifier as shown in FIG. 13 includes: an amplifying element (FET) 804; a microstrip line 805 connected to output terminal A of FET 804, with a length corresponding to one-quarter of a wavelength λ (λ/4) of the fundamental wave of the input signal; a microstrip line (open stub) 806 and a microstrip line (open stub) 807, both with one end connected to an output terminal B of a microstrip line 805, and the other end open; an output matching circuit 808 for the fundamental wave of, the input signal; and a load resistor 809. The conventional radio frequency power amplifier shown in FIG. 13 also includes an input terminal 801 connected to a gate electrode of a FET 804 for inputting a radio frequency signal; and a choke inductor 803 for cutting a radio frequency signal, having one end connected to an output terminal A of a FET 804, and having the other end connected to a direct current power supply terminal 802 of a drain bias.

A harmonic wave control circuit including the microstrip line 805, the open stub 806, and the open stub 807 is included in the conventional radio frequency power amplifier shown in FIG. 13. Here, the microstrip line 805 has a line length of one-quarter wavelength (λ/4), the open stub 806 has a line length of one-eighth wavelength (λ/8), and the open stub 807 has a line length of one-twelfth wavelength (λ/12). Due to the open stub 806 having a line length of one-eighth wavelength, impedance at the point B is short circuited with respect to a second harmonic wave. Furthermore, due to the microstrip line 805 having a line length of one-quarter wavelength, load impedance as seen from the point A, which is the output terminal of the FET 804, is short circuited with respect to a second harmonic wave. Again, due to the open stub 807 having a line length of one-twelfth wavelength, impedance at the point B is short circuited with respect to a third harmonic wave. Furthermore, due to the microstrip line 805 having a line length of one-quarter wavelength, load impedance as seen from the point A, which is the output terminal of the FET 804, is opened with respect to a third harmonic wave. Thus, the conditions of the harmonic wave control circuit are satisfied. With the conditions satisfied, the drain voltage waveform becomes a waveform closer to a square wave, and the area of the overlapping portion of the drain voltage waveform and drain current waveform decreases. Consequently, the power consumed by the FET 804 decreases, resulting in extremely-high power added efficiency.

Another intended use of the radio frequency power amplifier is in home appliances that use microwaves, such as microwave ovens. When a radio frequency power amplifier is used, for example, in a microwave oven, it is preferable that the radio frequency power amplifier is used in a saturation region, not in a linear region, in order to operate with high efficiency and at high power. Compared to operation in a linear region, operation in a saturation region produces high power added efficiency, but signal distortion is also generated. For this reason, the radio frequency power amplifier is not suitable for use in the communications field, but it is suitable for use in the field of home appliances with microwaves, typified by the microwave oven. However, when use in a home appliance with microwaves is being considered, an output power at least one order of magnitude or greater than specified of a mobile communication base station is required.

In general, transistors that are compound semiconductors made with gallium arsenide (GaAs) have been widely used as an amplifying element for use in radio frequency power amplifiers. However, in recent years, new device architectures for high power operation, or devices made with new materials which are capable of high voltage operation, such as silicon carbide (SiC) or gallium nitride (GaN), have been developed more actively in various institutes.

In order to achieve high power performance of a radio frequency power amplifier, a transistor needs to operate at high current and high voltage. While operation under high current is possible by increasing transistor size, achievement of operation under high voltage is not easy, even by using SiC or GaN, both of which have a high dielectric breakdown field. A field plate structure is widely known to increase the breakdown voltage of a transistor.

FIG. 14A is a cross-sectional view of a conventional GaN-based field effect transistor (FET), while FIG. 14B is a cross-sectional view of a field effect transistor (FET) having a field plate structure.

As shown in FIG. 14A, a conventional GaN-based FET is formed on a substrate 700, on top of which is a buffer layer 701. On top of that, a GaN channel layer 702 and an AlGaN electron donor layer 703 made from GaN with added aluminum (Al) are formed with a heterojunction of the two layers. On top of the AlGaN electron donor layer 703, a source electrode 704, a gate electrode 705, and a drain electrode 706 are formed. Also provided between each of the source electrode 704, the gate electrode 705, and the drain electrode 706, is an interlayer film 707. Included above and between the electrodes is an interlayer film 708.

In the conventional FET shown in FIG. 14A, a two-dimensional electron gas (electrons) is generated in the interface between the GaN channel layer 702 and the AlGaN electron donor layer 703 by the heterojunction of the two layers. These electrons contribute to the current between the source electrode 704 and the drain electrode 706, and the current value can be controlled by the voltage value applied to the gate electrode 705.

Also, as shown in FIG. 14B of a FET having a field plate structure, a gate electrode 705A protrudes out over an interlayer film 707, stretching towards a drain electrode 706 in an eaves shape. Due to this configuration, the electric field across the drain electrode 706 and the gate electrode 705A gathered in the vicinity of the gate electrode 705A is relaxed, and a FET having a high breakdown voltage can be realized. Other conventional field effect transistors having a field plate structure include those with a source electrode that protrudes out to between a gate electrode and a drain electrode, and those with a second, additional source electrode placed in between a gate electrode and a drain electrode. Additionally, a FET having a field plate structure for both a gate electrode and a source electrode has also been proposed as a FET configuration to increase the breakdown voltage of a FET (PTL 2).

[Citation List]
[Patent Literature]
[PTL 1] Japanese Unexamined Patent Application Publication No. 06-204764
[PTL 2] Japanese Unexamined Patent Application Publication No. 2008-277604

SUMMARY OF INVENTION

The inventors of the present invention have found that when a FET having a field plate structure is used to increase the output power of a radio frequency power amplifier, power added efficiency drops significantly. Furthermore, the inventors have found that even if a class F amplifier circuit is with the intent of increasing efficiency, the resulting increase in power added efficiency is not sufficient.

Accordingly, the object of the present invention is to provide a radio frequency power amplifier with high-output and high power added efficiency that solves the problems described above.

In order to achieve the goals described above, the radio frequency power amplifier according to an aspect of the present invention includes an amplifying element which amplifies the radio frequency signal of a first frequency, an input matching circuit connected to an input terminal of the amplifying element, an output matching circuit connected to a output terminal of the amplifying element, and a reactance control circuit having one end connected to an output terminal of the amplifying element, and the other end connected to an input terminal of the output matching circuit and to a direct current power supply terminal, wherein the reactance control circuit has a reactance which resonates at a second frequency with a parasitic capacitance of the amplifying element at the output terminal of the amplifying element, and the second frequency is identical or close to the first frequency.

In accordance with the present invention, the power consumed inside the amplifying element can be reduced because the distortion of the drain voltage waveform and drain current waveform caused by the parasitic capacitance of the amplifying element can be reduced. Consequently, a radio frequency power amplifier with high-output power and high power added efficiency can be realized.

DETAILED DESCRIPTION OF INVENTION

Figure 1:
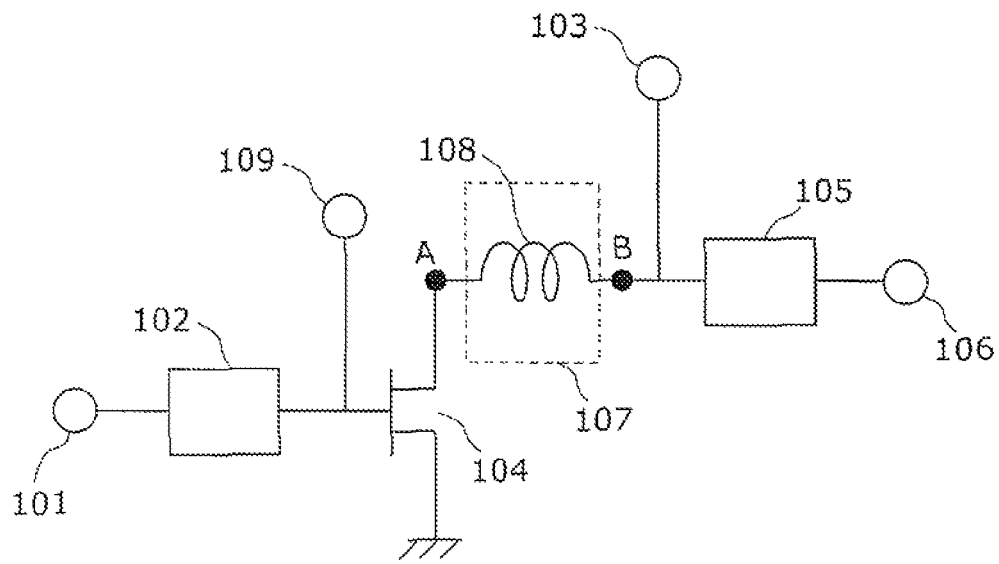
FIG. 1 is a circuit diagram of a radio frequency power amplifier according to a first embodiment of the present invention.

The radio frequency power amplifier according to an aspect of the present invention includes an amplifying element which amplifies the radio frequency signal of a first frequency, an input matching circuit connected to an input terminal of the amplifying element, an output matching circuit connected to an output terminal of the amplifying element, and a reactance control circuit having one end connected to the output terminal of the amplifying element, and the other end connected to an input terminal of the output matching circuit and to a direct current power supply terminal, wherein the reactance control circuit has a reactance which resonates at a second frequency with a parasitic capacitance of the amplifying element at the output terminal of the amplifying element, and the second frequency is identical or close to the first frequency.

In accordance with the present invention, the reactance of the parasitic capacitance of the amplifying element is decreased by the resonation of the reactance of the reactance control circuit and the parasitic capacitance of the amplifying element. As a result, the charging and discharging of a drain current, which hinders an increase in power added efficiency at the time of radio frequency operation, is suppressed, allowing for high-efficiency operation of the radio frequency power amplifier.

Additionally, according to an aspect of the present invention, it is preferable that the second frequency be a frequency where power added efficiency is higher than when the radio frequency power amplifier does not provide a reactance control circuit.

Also, according to an aspect of the present invention, when the first frequency is from 2.4 to 2.5 GHz, it is preferable that the second frequency be 0.82 to 2.4 times the first frequency. Furthermore, when this is the case, it is even more preferable that the second frequency be 0.87 to 1.9 times the first frequency.

Also, according to an aspect of the present invention, when the first frequency is from 1 to 5 GHz, it is preferable that the second frequency be 0.92 to 1.8 times the first frequency. Furthermore, when this is the case, it is even more preferable that the second frequency be 0.93 and 1.4 times the first frequency.

Also, according to an aspect of the present invention, it is preferable that the second frequency be higher than the first frequency. When this is the case, the power added efficiency of the radio frequency power amplifier can be maximized.

Also, according to an aspect of the present invention, it is preferable that the reactance control circuit include an inductor. As a result, insertion loss can be reduced since the number of components constituting a reactance control circuit is small and its composition is simple.

Also, according to an aspect of the present invention, it is preferable that the reactance control circuit be constituted of transmission lines. As a result, a reactance control circuit can be configured on a low loss module substrate widely used in circuits such as output matching circuits.

Furthermore, it is preferable that the transmission line be a microstrip line or a coplanar line. This makes it easy for the second frequency to be designed when a reactance control circuit is configured on the module substrate.

Also, according to an aspect of the present invention, it is preferable that the reactance control circuit include a serial resonance circuit of a capacitor and an inductor.

Also, according to an aspect of the present invention, it is preferable that the reactance control circuit include an open stub.

Also, according to an aspect of the present invention, it is preferable that the amplifying element be a field effect transistor having a gate electrode and a source electrode, at least one of which has a field plate structure. In this case, although the breakdown voltage of the amplifying element increases, thus increasing the output power, the parasitic capacitance of the amplifying element increases, decreasing the power added efficiency. However, by adjusting the second frequency, it is possible to increase power added efficiency beyond that of a conventional configuration which does not have a field plate structure.

Furthermore, it is preferable that the amplifying element be a field effect transistor made of a compound semiconductor. This makes it possible to enhance radio frequency characteristics.

Also, it is preferable that the amplifying element be a field effect transistor having a heterojunction of GaN and AlGaN.

Embodiments of the present invention will be explained below with reference to the attached drawings.

[First Embodiment]

FIG. 1 shows a circuit diagram of a radio frequency power amplifier according to a first embodiment of the present invention.

As shown in FIG. 1, the radio frequency power amplifier according to a first embodiment of the present invention has an input matching circuit 102, a transistor 104 which is an amplifying element, a reactance control circuit 107, and an output matching circuit 105. An input terminal 101 of the radio frequency signal is connected to an input side of an input matching circuit 102, and a bias terminal 109 is connected to an output side of the input matching circuit 102. Direct current voltage to drive the transistor 104 is applied to a gate electrode of the transistor 104 via the bias terminal 109. Also, a bias terminal 103 is connected to an input side of an output matching circuit 105. Direct current voltage to drive the transistor 104 is applied to a drain electrode of the transistor 104 via the bias terminal 103. Furthermore, an output terminal 106 that outputs an amplified radio frequency signal is connected to an output side of the output matching circuit 105. It is preferable that a choke inductor, quarter-wave line, and a capacitor be installed to the direct voltage input side of both the bias terminals 109 and 103 to prevent a radio frequency signal from leaking to the bias terminals 109 and 103.

The radio frequency signal is transmitted from the input terminal 101 to the transistor 104 without impedance mismatch by the input matching circuit 102, and is amplified by the transistor 104. The amplified radio frequency signal passes through the reactance control circuit 107, is transmitted from the transistor 104 to output terminal 106 without mismatch by the output matching circuit 105, then is output through the output terminal 106 and supplied to a load.

In the first embodiment, the reactance control circuit 107 composed of an inductor 108 is configured as follows: an input side (one end) of the inductor 108 is connected in serial to an output terminal (point A) of the transistor 104. An output side (the other end) of the inductor 108 is connected to an input terminal (point B) of the output matching circuit 105. In the first embodiment, the inductance of the inductor 108 is set to decrease the reactance of parasitic capacitance of the transistor 104 at its output terminal (point A). Specifically, it is set so that the inductance of the inductor 108 and the parasitic capacitance of the transistor 104 resonate at a frequency identical or close to a signal frequency. Thus, the inductance of the inductor 108 is configured to resonate with the parasitic capacitance of the transistor 104 at an output terminal of the transistor 104. The frequency at this time (second frequency) is configured so that it is identical or close to the input radio frequency signal (first frequency). Furthermore, said second frequency has a power added efficiency that is greater than in a configuration without the reactance control circuit 107 (inductor 108).

Figure 2A:
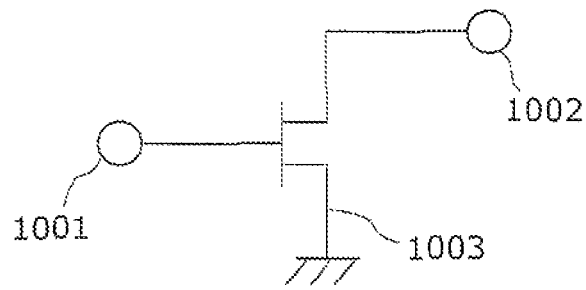
FIG. 2A is a circuit diagram showing the configuration of a general FET.
Figure 2B:
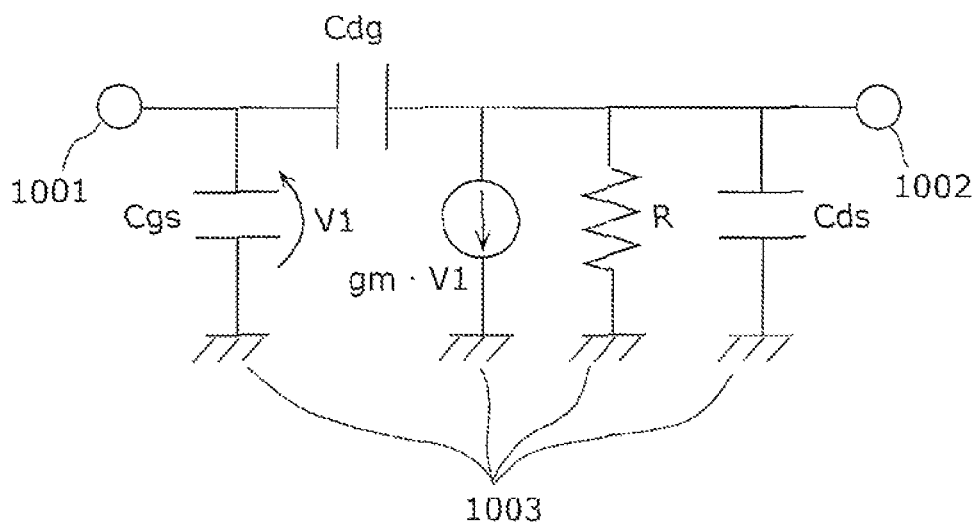
FIG. 2B is a diagram of a FET analogous circuit shown in FIG. 2A displaying parasitic capacitance and such.

A method of setting the inductance of the inductor 108 will be explained below with reference to FIG. 2A and FIG. 2B. FIG. 2A is diagram of a general field effect transistor (FET).

As shown in FIG. 2A, in general, a FET includes a gate electrode 1001, a drain electrode 1002, and a grounded source electrode 1003, with parasitic capacitance between the respective electrodes. Here, parasitic capacitance between the gate electrode 1001 and the source electrode 1003 is defined as Cgs; parasitic capacitance between the drain electrode 1002 and the gate electrode 1001 is defined as Cdg; and parasitic capacitance between the drain electrode 1002 and the source electrode 1003 is defined as Cds. Also, drain current is proportional to potential difference V1 applied across both ends of Cgs, and the mutual conductance is defined as gm. Furthermore, when drain conductance is defined as R; a field effect transistor in FIG. 2A is displayed as an analogous circuit as shown in FIG. 2B, displaying parasitic capacitance and conductance.

Therefore, parasitic capacitance C of a transistor viewed from drain electrode 1002 of a transistor can be calculated from the serial capacity of Cgs and Cdg, and the parallel capacity of Cds with Equation 1 seen below.

[Math. 1]

$$C = C_{ds} + \frac{C_{gs} \times C_{dg}}{C_{gs} + C_{dg}} \quad \text{(Equation 1)}$$

A relational expression Equation 2 is satisfied, where resonance frequency is defined as F, parasitic capacitance of the transistor 104 calculated in Equation 1 is defined as C, and inductance of inductor 108 is defined as L. Inductance L can be calculated from this relational expression.

[Math. 2]

$$F = \frac{1}{2\pi\sqrt{LC}} \quad \text{(Equation 2)}$$

For example, when Cgs=0.4 pF, Cdg=0.35 pF, and Cds=0.2 pF, the parasitic capacitance C of the transistor 104 is approximately 0.39 pF. Thus, in order to tune a resonance frequency of 2.45 GHz, inductance L should be set to 10.8 nH.

Figure 3:
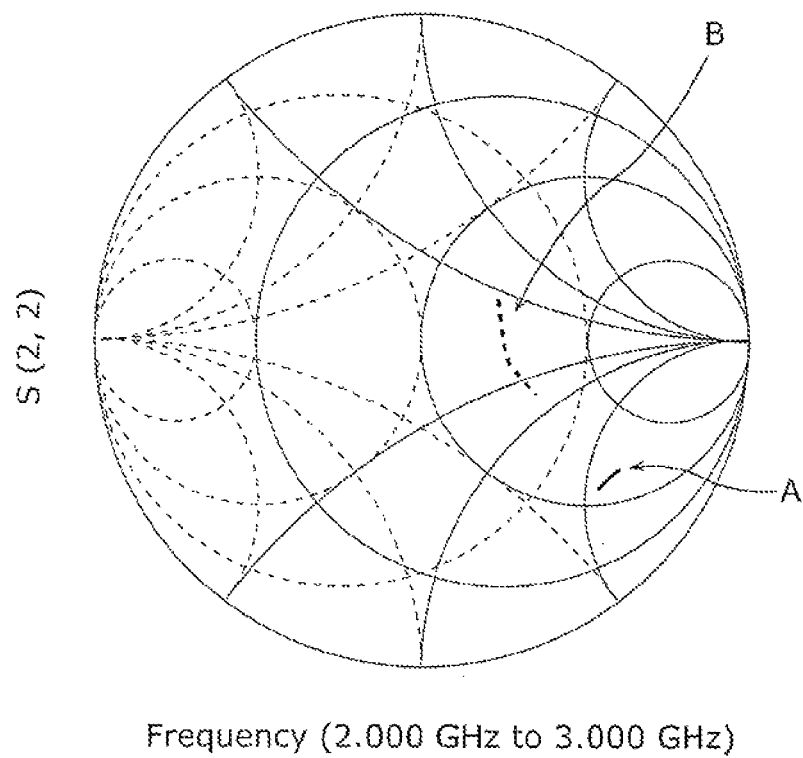
FIG. 3 is a Smith chart of a radio frequency power amplifier according to a first embodiment of the present invention.

FIG. 3 is a Smith chart plotting the output impedance of the radio frequency power amplifier according to the first embodiment of the present invention, with plots for: output impedance of the transistor 104 as seen from the point A on the output terminal of the transistor 104 in FIG. 1 (solid line); and output impedance of the transistor 104 as seen from the point B (dashed line). The output impedances of the transistor 104 shown in the Smith chart were obtained as the results of a test simulation, where the FET parameters in an actual prototype GaN high electron mobility transistor (GaN-HEMT) were extracted, and a signal frequency from 2 to 3 GHz was used. The FET parameters that were used as parasitic capacitances were Cgs=0.9 pF, Cdg=0.3 pF, and Cds=0.15 pF. Also, the transistor drain conductance R was set to 700Ω, and the maximum mutual conductance gm was set to 150 mS/mm. Also, the inductance L was set to 10 nH. As depicted in FIG. 3, the output impedance of the transistor 104 at the point B is more capable of reducing a reactance component than the output impedance of the transistor 104 at the point A.

Next, the power added efficiency (PAE) of a radio frequency power amplifier will be discussed in the following cases with reference to FIG. 4 through FIG. 6.: a radio frequency power amplifier which has a transistor (FET) having a field plate structure; a radio frequency power amplifier which has a transistor (FET) not having a field plate structure; a radio frequency power amplifier which has a reactance control circuit; and a radio frequency power amplifier which does not have a reactance control circuit.

Figure 4:
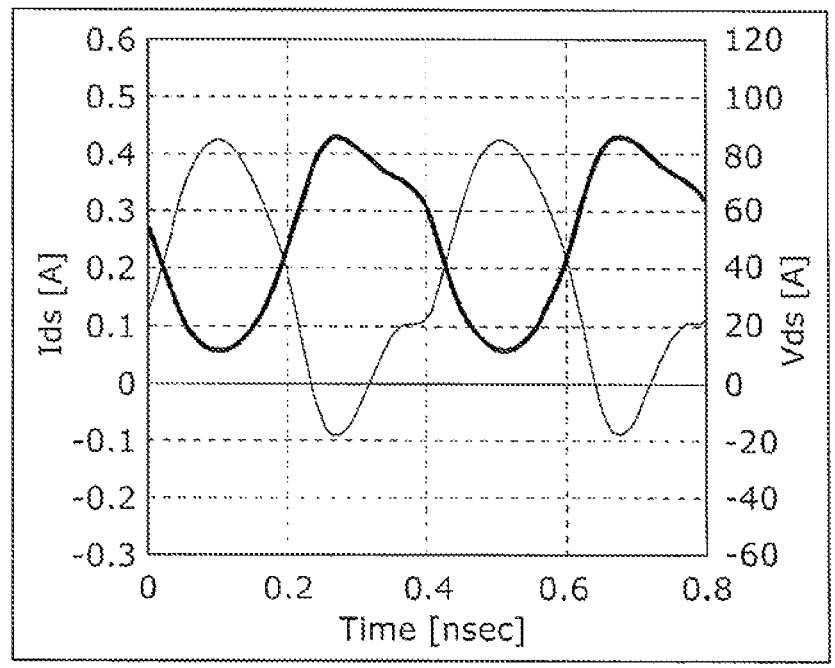
FIG. 4 is a graph showing the relationship between a drain current waveform and a drain voltage waveform in a radio frequency power amplifier without a reactance control circuit, and with a FET not having a field plate structure.
Figure 5:
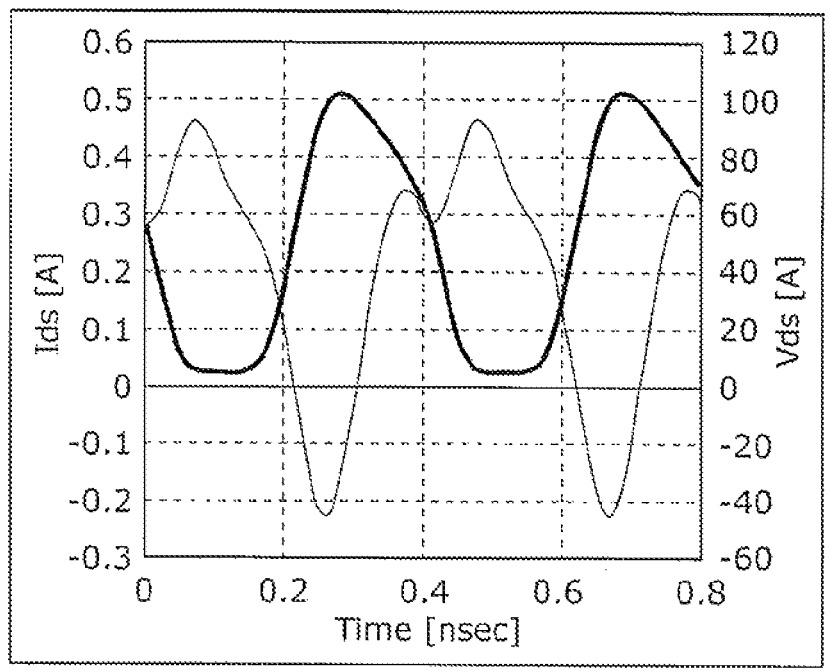
FIG. 5 is a graph showing the relationship between a drain current waveform and a drain voltage waveform in a radio frequency power amplifier without a reactance control circuit, and with a FET having a field plate structure.
Figure 6:
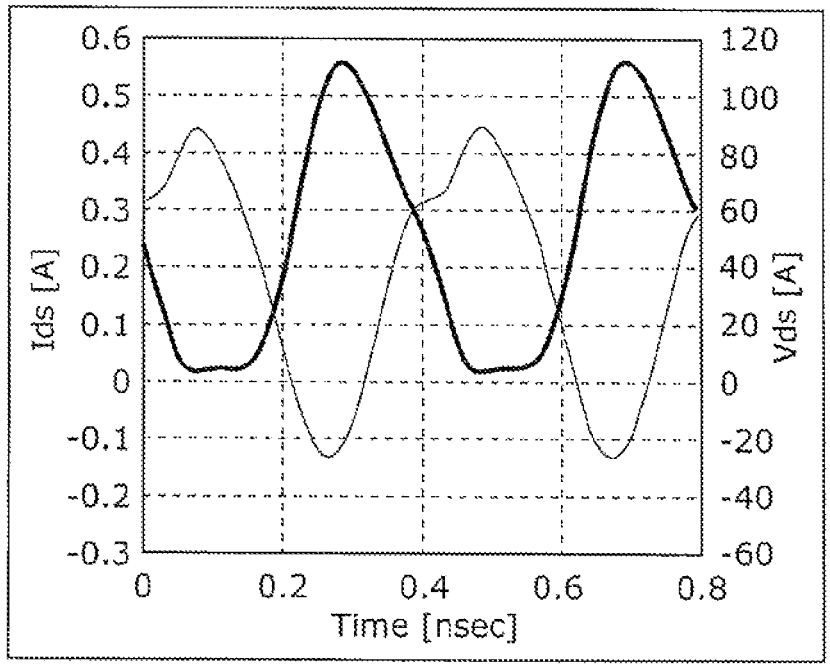
FIG. 6 is a graph showing the relationship between a drain current waveform and a drain voltage waveform in the first embodiment of the present invention of a radio frequency power amplifier with a reactance control circuit, and with a FET having a field plate structure.

FIG. 4 through FIG. 6 show the results of simulations of drain voltage and drain current of a transistor before and after introduction of the reactance control circuit 107 shown in FIG. 1. TABLE 1 shows the FET parameters and reactance control circuit inductance values used for the simulations.

TABLE 1

| | FET Parameters | Cgs (pF) | Cdg (pF) | Cds (pF) | R (Ω) | gm (mS/mm) | L (nH) |
|---|---|---|---|---|---|---|---|
| (a) | Without a field plate; without a reactance control circuit | 0.3 | 0.25 | 0.15 | 700 | 150 | — |
| (b) | With a field plate; without a reactance control circuit | 0.9 | 0.3 | 0.15 | 700 | 150 | — |
| (c) | With a field plate; with a reactance control circuit | 0.9 | 0.3 | 0.15 | 700 | 150 | 10 |

Direct current bias conditions were set such that the drain voltage would be 30 V and the drain current would be 33 mA as the operating point of the FET. The drain voltage was set to 30 V, and the gate voltage was set such that the drain current would be 33 mA. Also, as matching conditions for each simulation, the input matching circuit 102 performs gain matching, and the output matching circuit 105 performs efficiency matching. A signal frequency of 2.45 GHz was used for each simulation.

FIG. 4 is a graph in the case of a FET without a field plate structure and without a reactance control circuit (condition (a) of TABLE 1). FIG. 5 is a graph in the case of a FET with a field plate structure, but without a reactance control circuit (condition (b) of TABLE 1). FIG. 6 is a graph in the case of a FET with a field plate structure and with a reactance control circuit (condition (c) of TABLE 1). In FIG. 4 through FIG. 6, the vertical axis of the graph represents the drain voltage Vds (right-hand scale) and the drain current Ids (left-hand scale), while the horizontal axis represents time. In each graph, the thin solid line represents the drain current waveform, and the bold solid line represents the drain voltage waveform.

In order to operate at a high-efficiency, it is necessary to reduce the power that is consumed inside a transistor. The power consumed inside a transistor can be calculated by calculating the time integral of the product of drain voltage and drain current. In FIG. 4 in which a FET does not have a field plate structure, the distortion of the drain current waveform is relatively small, and the amplitude is also small. The power added efficiency (PAE) in this case is 60.3%.

Conversely, in FIG. 5 in which a FET has a field plate structure, the drain current waveform is greatly distorted and severely fluctuates between positive and negative values, especially in regions of high drain voltage. This is the charge and discharge of the drain current caused by the parasitic capacitance of a transistor, which occurs notably in the time periods when the drain voltage is high. As a result, a large amount of power is consumed inside the transistor, hindering high-efficiency operation. The power added efficiency (PAE) in this case is 58.9%, lower than the 60.3% power added efficiency in FIG. 4 in which a FET does not have a field plate structure. Also, due to the distortion of the drain current waveform occurring notably in time regions where drain voltage is high, even if the harmonic wave is processed by a class F amplifier circuit to make the drain voltage waveform a square wave, reducing the amount of power consumed inside a transistor is difficult, and power added efficiency is not improved.

Next, as shown in FIG. 6 in which a FET has a field plate structure and a reactance control circuit is inserted, the distortion of the drain current waveform is reduced, and the fluctuations between positive and negative values in the regions of high drain voltage decrease. In this case, power added efficiency (PAE) increased in comparison to the case without a reactance control circuit to 65.0%. Furthermore, since the distortion of the drain current waveform is reduced, a significant increase in power added efficiency can be expected by processing the harmonic wave with a class F amplifier circuit.

Next, the power added efficiency (PAE) of a radio frequency power amplifier with a transistor that is a GaN HEMT will be discussed with reference to FIG. 7 through FIG. 9.

Figure 7:
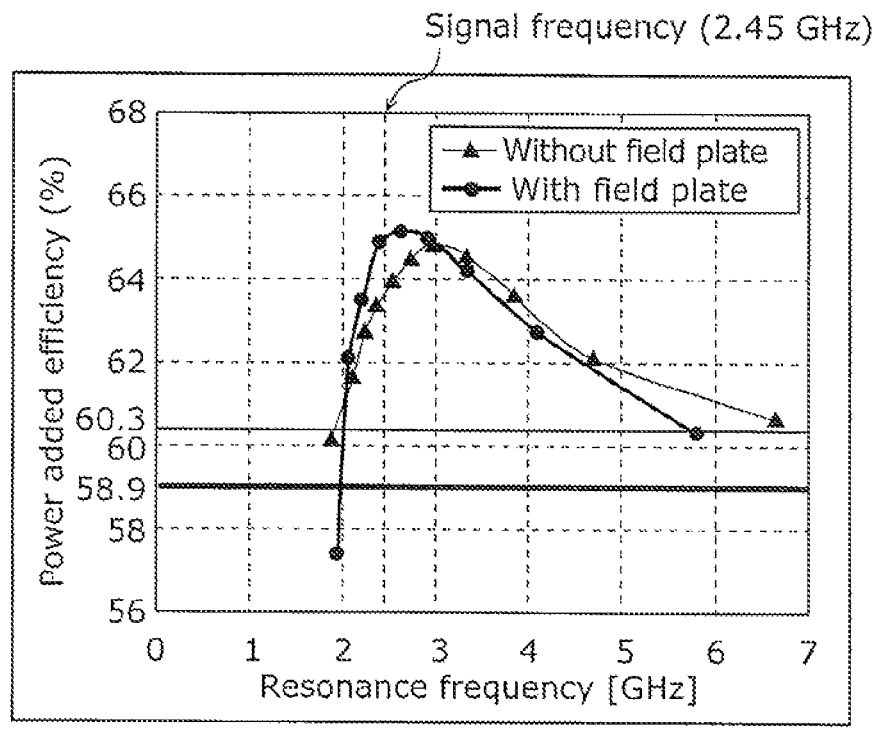
FIG. 7 is a graph showing the relationship between resonance frequency and power added efficiency of the first embodiment of the present invention, wherein the signal frequency is 2.45 GHz.

FIG. 7 is a graph showing the PAE simulation results of a GaN HEMT having a field plate structure and a GaN HEMT not having a field plate structure, obtained by altering the inductance of a reactance control circuit. The values listed in conditions (a) and (b) of TABLE 1 were used as the FET parameters for the simulations. In FIG. 7, the horizontal axis represents the resonance frequency of the inductance from the reactance control circuit and the parasitic capacitance of the transistor, while the vertical axis represents power added efficiency (PAE). The PAE of the GaN HEMT not having a field plate structure is represented by the thin curved line, while the PAE of the GaN HEMT having a field plate structure is represented by the bold curved line. In FIG. 7, each PAE result in the cases where a reactance control circuit is not provided is also shown.

As shown in FIG. 7, when a reactance control circuit is not provided, the PAE of a GaN HEMT not having a field plate structure is 60.3%, as represented by the solid thin line. Similarly, when a reactance control circuit is not provided, the PAE of a GaN HEMT having a field plate structure is 58.9%, as represented by the solid bold line.

As depicted by the two curved lines in FIG. 7, the PAE of the radio frequency power amplifier increases when a reactance control circuit is provided and the resonance frequency is set to be identical or close to the signal frequency, regardless of whether a field plate structure is provided or not, more so than when a reactance control circuit is not provided.

The PAE decreased from 60.3% to 58.9% when a reactance control circuit was not provided because the parasitic capacitance of the amplifying element increased as a result of the use of a field plate structure. However, providing a reactance control circuit as well as setting the inductance of the reactance control circuit to resonate at a frequency identical or close to the signal frequency will yield a PAE that is equal to the PAE of a radio frequency power amplifier using a transistor not having a field plate structure.

Conventionally, an inductor is not provided on the output terminal of a transistor because it is known to have output transmission loss. However, the inventors of this application found that power added efficiency could be greatly increased by providing a reactance control circuit on the output terminal of a transistor and setting the inductance of the reactance control circuit to resonate at a frequency identical or close to the signal frequency. Furthermore, the inventors of this application found the result of increasing the power added efficiency of a reactance control circuit to be even more remarkable when a large parasitic capacitance transistor such as a GaN HEMT having a field plate structure is used. Hence, a radio frequency power amplifier with high power added efficiency which uses a high output power amplifying element such as a GaN HEMT having a field plate structure can be realized.

Next, the setting range of the resonance frequency resonating a reactance control circuit with the parasitic capacitance of the amplifying element will be discussed. According to the results shown in FIG. 7, in order to increase the power added efficiency beyond that of a conventional configuration in which a reactance control circuit is not provided, it is preferable that the resonance frequency be within a range of 2.0 to 6.0 GHz. In this case, when the signal frequency is 1, it is preferable that the resonance frequency be 0.82 to 2.4 times the signal frequency. It is also preferable that the resonance frequency be within a range of 2.1 to 4.7 GHz in order to increase the power added efficiency to approximately 62% or more. In this case, when the signal frequency is 1, it is preferable that the resonance frequency be 0.87 to 1.9 times the signal frequency. When these ranges are used, compared to conventional configurations in which a reactance control circuit is not provided, a sufficient increase in power added efficiency can be achieved regardless of whether a field plate structure is used or not.

Also, when a radio frequency power amplifier according to the present invention is used in a microwave oven, the signal frequency must be from 2.4 to 2.5 GHz by law. While the simulation shown in FIG. 7 used a signal frequency of 2.45 GHz, a simulation using a signal frequency of 2.4 GHz or 2.5 GHz will yield results that do no vary by more than approximately 2% of the result shown in FIG. 7. Therefore, a graph showing the relationship between the resonance frequency and the power added efficiency would only shift slightly by this change in signal frequency, and would show a nearly identical trend. Thus, when applied to a microwave oven, in other words, when the signal frequency is from 2.4 to 2.5 GHz, in order to increase the power added efficiency beyond that of a conventional configuration in which a reactance control circuit is not provided, it is preferable that the resonance frequency be 0.82 to 2.8 times the signal frequency. Also, to sufficiently increase the power added efficiency beyond that of a conventional configuration in which a reactance control circuit is not provided, it is preferable that the resonance frequency be 0.87 to 1.9 times the signal frequency.

Figure 8:
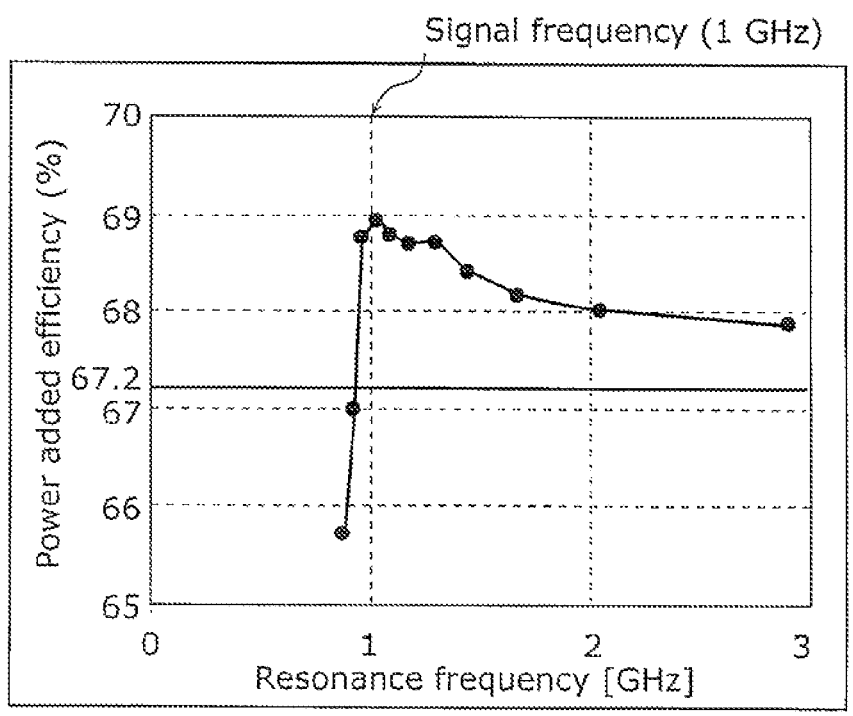
FIG. 8 is a graph showing the relationship between resonance frequency and power added efficiency of the first embodiment of the present invention, wherein the signal frequency is 1 GHz.
Figure 9:
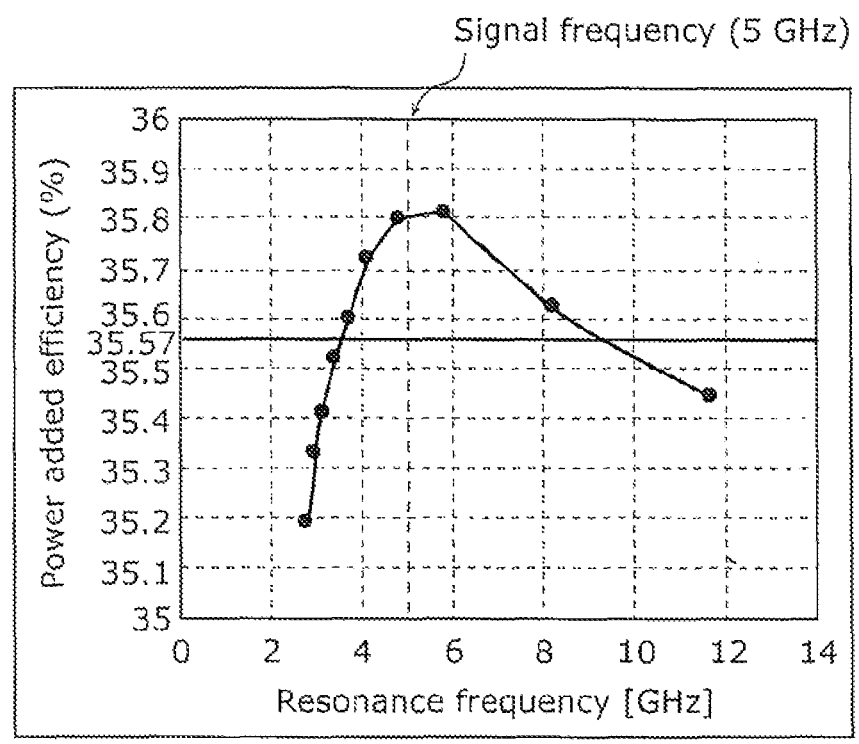
FIG. 9 is a graph showing the relationship between resonance frequency and power added efficiency of the first embodiment of the present invention, wherein the signal frequency is 5 GHz.

FIG. 8 and FIG. 9 are graphs showing simulation results of a GaN HEMT having a field plate structure when the signal frequency is altered furthermore. The values listed in condition (b) of TABLE 1 are used as the FET parameters in both FIG. 8 and FIG. 9.

FIG. 8 is a graph showing the result of a simulation of a GaN HEMT having a field plate structure when the signal frequency was set to 1 GHz. In FIG. 8, the horizontal axis represents the resonance frequency of the inductance from a reactance control circuit and the parasitic capacitance of the transistor, while the vertical axis represents PAE.

As shown in FIG. 8, the PAE of a radio frequency power amplifier without a reactance control circuit and with a GaN HEMT having a field plate structure is 67.2%. Thus, according to the results shown in FIG. 8, in order to increase the power added efficiency beyond that of a conventional configuration in which a reactance control circuit is not provided, it is preferable that the resonance frequency be higher than 0.92 GHz, and, in particular, be within a range of 0.92 to 3.0 GHz. In this case, when the signal frequency is 1, it is preferable that the resonance frequency be 0.92 to 3.0 times the signal frequency. It is also preferable that the resonance frequency be within a range of 0.93 to 2.0 GHz in order to increase the power added efficiency to 68% or more. In this case, when the signal frequency is 1, it is preferable that the resonance frequency be 0.93 to 2.0 times the signal frequency.

FIG. 9 is a graph showing the result of a simulation of a GaN HEMT having a field plate structure when the signal frequency was set to 5 GHz. In FIG. 9, the horizontal axis represents the resonance frequency of the inductance from a reactance control circuit and the parasitic capacitance of a transistor, while the vertical axis represents PAE.

As shown in FIG. 9, the PAE of a radio frequency power amplifier without a reactance control circuit is 35.57%. Thus, according to the results shown in FIG. 9, in order to increase the power added efficiency beyond that of a conventional configuration in which a reactance control circuit is not provided, it is preferable that the resonance frequency be within a range of 3.5 to 9.3 GHz. In this case, when the signal frequency is 1, it is preferable that the resonance frequency be 0.7 to 1.8 times the signal frequency. It is also preferable that the resonance frequency be within a range of 4.0 to 7.2 GHz in order to increase the power added efficiency to 35.7% or more. In this case, when the signal frequency is 1, it is preferable that the resonance frequency be 0.8 to 1.4 times the signal frequency.

Thus, it is possible to increase the power added efficiency beyond that of a conventional configuration in which a reactance control circuit is not provided, even when the signal frequency is from 1 to 5 GHz, by setting the resonance frequency 0.92 to 1.8 times the signal frequency. Also, it is possible to sufficiently increase the power added efficiency beyond that of a conventional configuration in which a reactance control circuit is not provided by setting the resonance frequency 0.93 to 1.4 times the signal frequency.

In the first embodiment, the input matching circuit is connected directly to the input terminal of the amplifying element, but it is acceptable to provide a circuit such as a harmonic wave control circuit or a gate bias circuit between the input terminal of the amplifying element and the input matching circuit.

Also, in the first embodiment, a circuit for increasing power added efficiency such as a class F amplifier circuit is not provided, but by using such a circuit, the power added efficiency can be increased even more. It is possible to increase the power added efficiency even more by providing a class F amplifier circuit particularly because the distortion of the drain current waveform and drain voltage waveform are reduced by the present invention.

[Second Embodiment]

Figure 10:
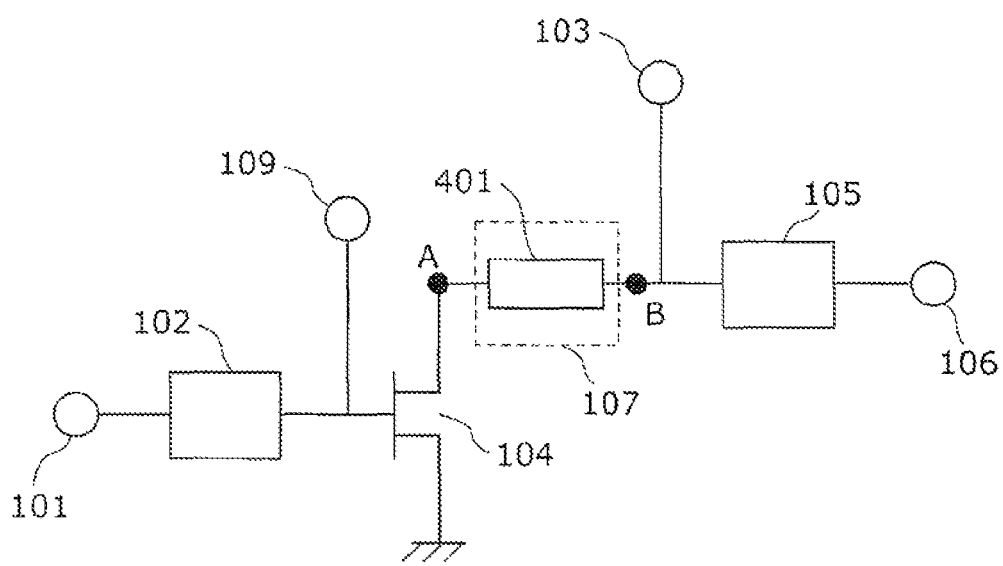
FIG. 10 is a circuit diagram of a radio frequency power amplifier according to a second embodiment of the present invention.

Next, FIG. 10 will be used to describe a second embodiment of a radio frequency power amplifier. FIG. 10 is a circuit diagram showing the second embodiment of a radio frequency power amplifier.

The difference between the first embodiment and the second embodiment of a radio frequency power amplifier is in the configuration of the reactance control circuit 107. Specifically, a microstrip line 401 is used as the reactance control circuit 107 in the second embodiment. Due to the fact that all other circuit configurations are identical to those of the first embodiment, and the components that are the same in FIG. 10 and FIG. 1 use the same reference signs, those descriptions will be omitted.

In the second embodiment, the reactance component can be adjusted depending on the line length and the characteristic impedance of the microstrip line 401 that forms the reactance control circuit 107. Therefore, as with the first embodiment, the line length and the characteristic impedance of the microstrip line 401 are adjusted so that the reactance from the parasitic capacitance of transistor 104 will decrease. As a result, the PAE of the radio frequency power amplifier will increase due to the decrease in drain current waveform distortion. Furthermore, due to class F operation by harmonic wave processing, a significant increase in power added efficiency can be expected.

[Third Embodiment]

Figure 11:
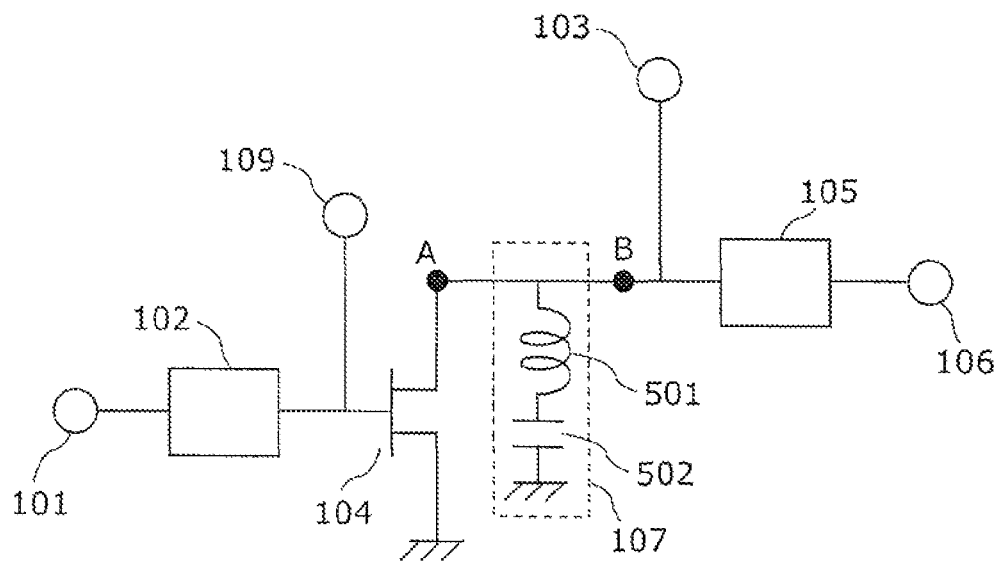
FIG. 11 is a circuit diagram of a radio frequency power amplifier according to a third embodiment of the present invention.

Next, FIG. 11 will be used to describe a third embodiment of a radio frequency power amplifier. FIG. 11 is a circuit diagram showing the third embodiment of a radio frequency power amplifier.

The difference between the first embodiment and the third embodiment of a radio frequency power amplifier is in the configuration of the reactance control circuit 107. Specifically, a series resonant circuit including an inductor 501 and a capacitor 502 is used as the reactance control circuit 107 in the third embodiment. Due to the fact that all other circuit configurations are identical to those of the first embodiment, and the components that are the same in FIG. 11 and FIG. 1 use the same reference signs, those descriptions will be omitted.

Here, resonance frequency is defined as F, the parasitic capacitance of transistor 104 is defined as C, the inductance of inductor 501 in the reactance control circuit is defined as L, and the capacitance of capacitor 502 is defined as C2. By satisfying the equation below (Equation 3), the reactance, caused by the parasitic capacitance of transistor 104, can be reduced, allowing for high-efficiency operation of the radio frequency power amplifier. Furthermore, the PAE of the radio frequency power amplifier will increase due to the decrease in drain current waveform distortion. Still furthermore, due to class F operation by harmonic wave processing, a significant increase in power added efficiency can be expected.

[Math. 3]

$$F = \frac{1}{2\pi}\sqrt{\frac{C+C2}{LCC2}} \qquad \text{(Equation 3)}$$

[Fourth Embodiment]

Figure 12:
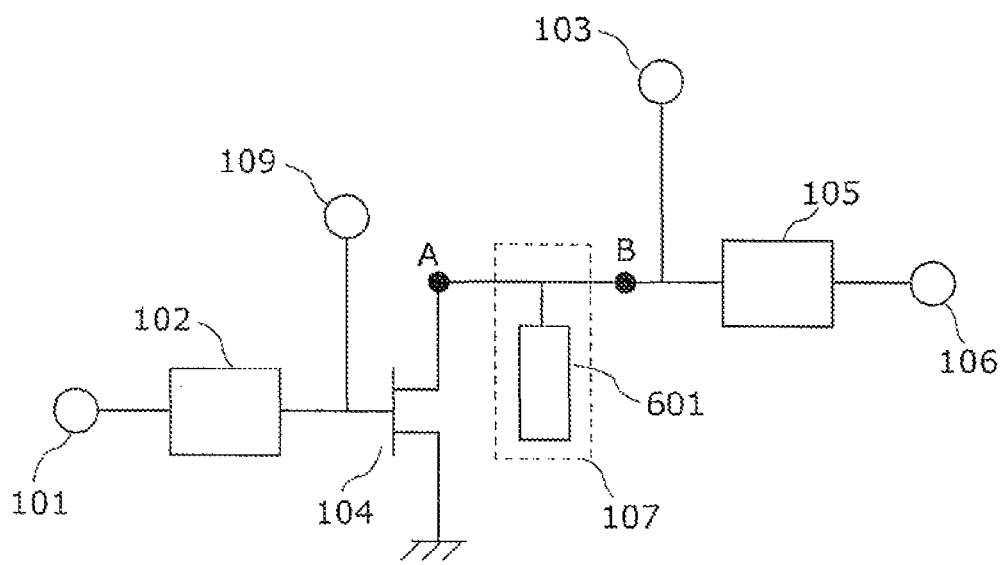
FIG. 12 is a circuit diagram of a radio frequency power amplifier according to a fourth embodiment of the present invention.
Figure 13:
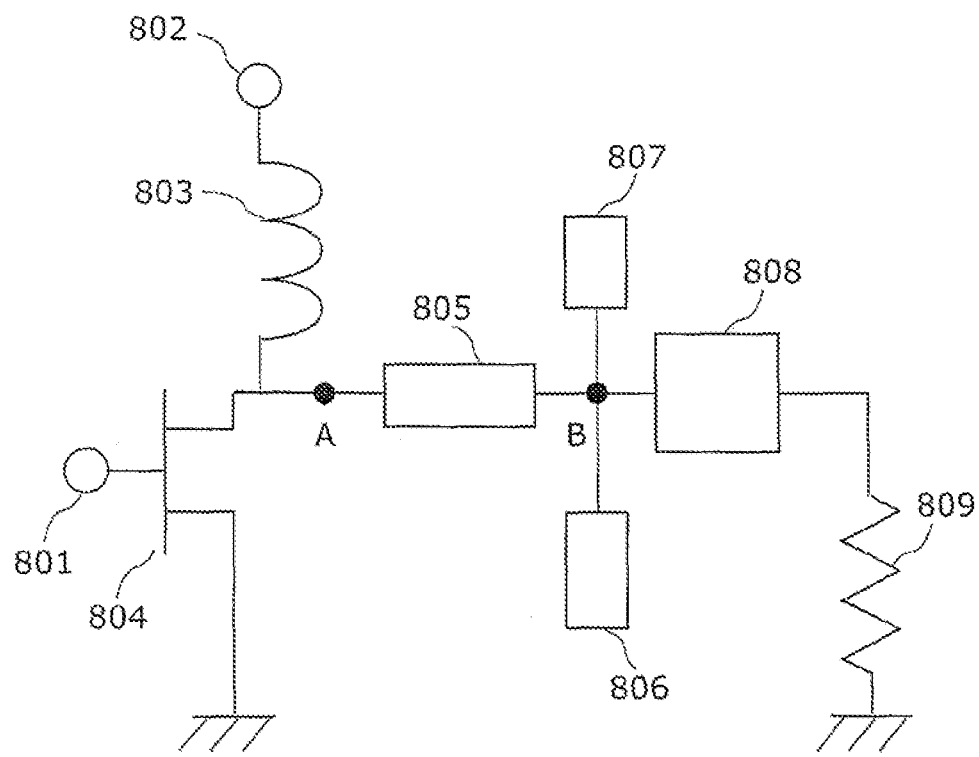
FIG. 13 is a circuit diagram of a class F amplifier that is a conventional radio frequency power amplifier using a FET.

Next, FIG. 12 will be used to describe a fourth embodiment of a radio frequency power amplifier. FIG. 12 is a circuit diagram showing the fourth embodiment of a radio frequency power amplifier.

The difference between the first embodiment and the fourth embodiment of a radio frequency power amplifier is in the configuration of the reactance control circuit 107. Specifically, an open stub 601 constituted of a microstrip line is used as the reactance control circuit 107 in the fourth embodiment. Due to the fact that all other circuit configurations are identical to those of the first embodiment, and the components that are the same in FIG. 12 and FIG. 1 use the same reference signs, those descriptions will be omitted.

As previously stated, since reactance can be adjusted by the line length and the characteristic impedance of the microstrip line, the line length and the characteristic impedance of the microstrip line should be set so that the reactance from the parasitic capacitance as seen from the output terminal of transistor 104 decreases. As a result, the PAE of the radio frequency power amplifier will increase due to the decrease in drain current waveform distortion. Furthermore, due to class F operation by harmonic wave processing, a significant increase in power added efficiency can be expected.

While the above descriptions are based on a radio frequency power amplifier according to the embodiments of the present invention of a radio frequency power amplifier, the present invention is not limited to these embodiments.

For example, the fourth embodiment describes a radio frequency power amplifier using a microstrip line, which is a single example of a transmission line, as the reactance control circuit 107, but the present invention is not limited to the use of a microstrip line. A different type of transmission line, such as a coplanar line, for example, may also be used.

Figure 14A:
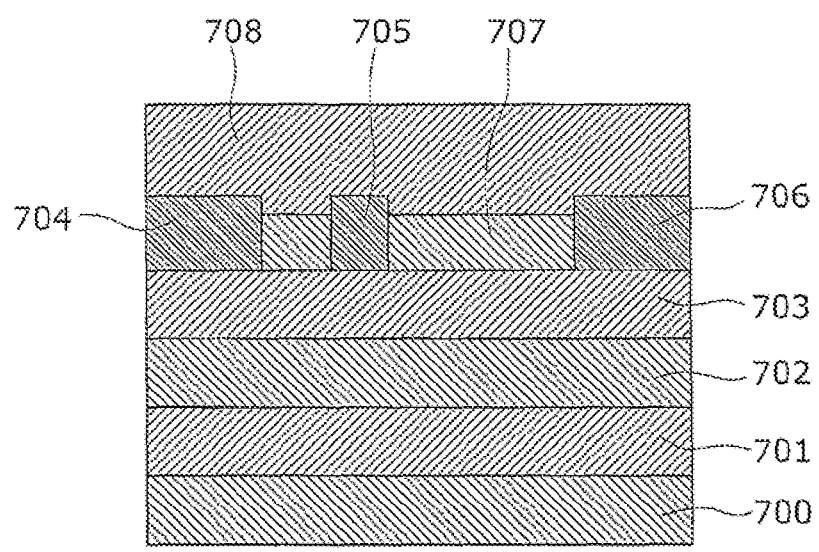
FIG. 14A is a cross-sectional view of a conventional FET containing GaN.
Figure 14B:
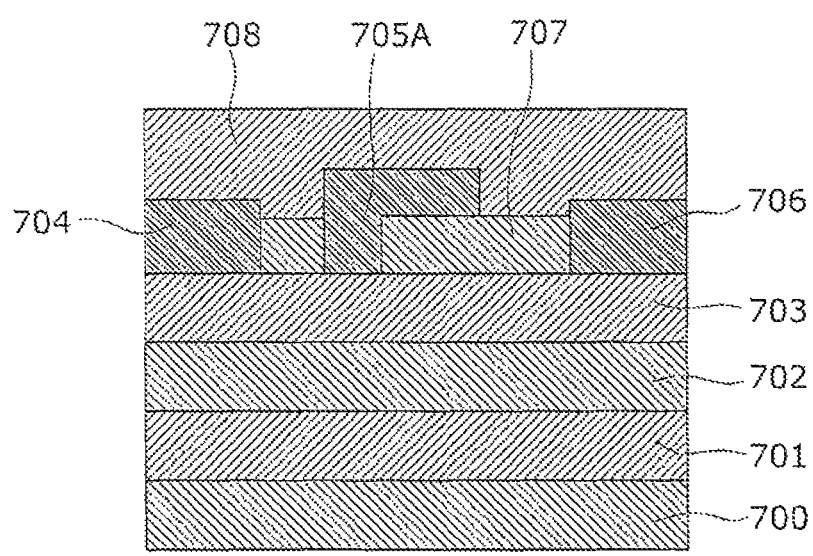
FIG. 14B is a cross-sectional view of a FET having a field plate structure.

Again, the fourth embodiment describes a radio frequency power amplifier using a FET or a HEMT having a field plate structure. Specifically, a FET or a HEMT having a gate electrode and a source electrode, at least one of which having a field plate structure. In this case, an electrode configuration such as the one described in FIG. 14B, for example, can be applied as a field plate structure.

In addition, various modifications of the embodiments as well as embodiments resulting from arbitrary combinations of constituent elements of different embodiments that may be conceived by those skilled in the art are intended to be included within the scope of the present invention as long as these do not depart from the essence of the present invention.

A radio frequency power amplifier according to the present invention is applicable to home electronics that use microwaves, such as a microwave oven, or mobile communication terminals and base stations.

REFERENCE SIGNS LIST

101 input terminal
102 input matching circuit
103 bias terminal
104 transistor
105 output matching circuit
106 output terminal
107 reactance control circuit
108 inductor
109 bias terminal
401 microstrip line
501 inductor
502 capacitor
601 open stub
801 input terminal
802 direct current power supply terminal
803 choke inductor
804 FET
805 microstrip line
806 open stub ($\lambda/8$)
807 open stub ($\lambda/12$)
808 output matching circuit
809 load resistance
704, 1003 source electrode
705, 705A, 1001 gate electrode
706, 1002 drain electrode

The invention claimed is:

1. A radio frequency power amplifier, comprising:
   an amplifying element that amplifies a radio frequency signal having a first frequency;
   an input matching circuit connected to an input terminal of the amplifying element;
   an output matching circuit connected to an output terminal of the amplifying element; and
   a reactance control circuit having one end connected to an output terminal of the amplifying element, and the other end connected to an input terminal of the output matching circuit and to a direct current power source terminal,
   wherein the amplifying element is a field effect transistor including a gate electrode, a drain electrode, and a source electrode,
   at least one of the gate electrode or the source electrode has a field-plate structure,
   the reactance control circuit has a reactance which resonates at a second frequency with a parasitic capacitance of the amplifying element at the output terminal of the amplifying element,
   the parasitic capacitance of the amplifying element is a parasitic capacitance held by the amplifying element calculated from inter-electrode parasitic capacitances between the gate electrode, the drain electrode and the source electrode,
   a parasitic capacitance C of the amplifying element is expressed by an equation $$C = Cds + \frac{Cgs \times Cdg}{Cgs \times Cdg}$$

where Cgs is a parasitic capacitance between the gate electrode and the source electrode, Cdg is a parasitic capacitance between the drain electrode and the gate electrode, and Cds is a parasitic capacitance between the drain electrode and the source electrode, and
the second frequency is identical or close to the first frequency.

2. The radio frequency power amplifier according to claim 1,
   wherein the second frequency is a frequency at which a power added efficiency is higher in the radio frequency power amplifier than in another radio frequency power amplifier that does not include the reactance control circuit.

3. The radio frequency power amplifier according to claim 1,
   wherein the first frequency is from 2.4 to 2.5 GHz, and the second frequency is 0.82 to 2.4 times the first frequency.

4. The radio frequency power amplifier according to claim 3,
   wherein the second frequency is 0.87 to 1.9 times the first frequency.

5. The radio frequency power amplifier according to claim 1,
   wherein the first frequency is from 1 to 5 GHz, and the second frequency is 0.92 to 1.8 times the first frequency.

6. The radio frequency power amplifier according to claim 5,
   wherein the second frequency is 0.93 to 1.4 times the first frequency.

7. The radio frequency power amplifier according to claim 1,
   wherein the second frequency is higher than the first frequency.

8. The radio frequency power amplifier according to claim 1,
   wherein the reactance control circuit includes an inductor.

9. The radio frequency power amplifier according to claim 1,
   wherein the reactance control circuit includes a transmission line.

10. The radio frequency power amplifier according to claim 9,
   wherein the transmission line is a microstrip line or a coplanar line.

11. The radio frequency power amplifier according to claim 1,
   wherein the reactance control circuit includes a serial resonator having a capacitor and an inductor.

12. The radio frequency power amplifier according to claim 1,
   wherein the reactance control circuit includes an open stub.

13. The radio frequency power amplifier according to claim 1,
   wherein the amplifying element is a field effect transistor made of a compound semiconductor.

14. The radio frequency power amplifier according to claim 1,
   wherein the amplifying element is a field effect transistor having a GaN/AlGaN heterojunction.

* * * * *